United States Patent
Kimoto et al.

(10) Patent No.: US 9,681,594 B2
(45) Date of Patent: Jun. 13, 2017

(54) ELECTROMAGNETIC SHIELDING MEMBER

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

(72) Inventors: Yuichi Kimoto, Mie (JP); Takeshi Shimizu, Mie (JP); Yasushi Itani, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/300,672

(22) PCT Filed: Mar. 20, 2015

(86) PCT No.: PCT/JP2015/058399
§ 371 (c)(1),
(2) Date: Sep. 29, 2016

(87) PCT Pub. No.: WO2015/156099
PCT Pub. Date: Oct. 15, 2015

(65) Prior Publication Data
US 2017/0118878 A1    Apr. 27, 2017

(30) Foreign Application Priority Data
Apr. 9, 2014  (JP) ................. 2014 080053

(51) Int. Cl.
*H05K 9/00* (2006.01)
*B60R 16/02* (2006.01)

(52) U.S. Cl.
CPC ....... *H05K 9/0081* (2013.01); *B60R 16/0215* (2013.01); *H05K 9/0098* (2013.01); *B60Y 2410/114* (2013.01)

(58) Field of Classification Search
CPC .......................... H05K 9/0098; B21C 37/157
See application file for complete search history.

(56) References Cited

U.S. PATENT DOCUMENTS 1,999,818 A * 4/1935 McIntyre .............. B21C 37/101
 138/165
3,273,601 A * 9/1966 De Gain ............... B21C 37/108
 138/166

(Continued)

FOREIGN PATENT DOCUMENTS

JP   H05069059 A    3/1993
JP   H11275731 A   10/1999

(Continued)

OTHER PUBLICATIONS

International Search Report and Written Opinion for Application No. PCT/JP2015/058399 Dated May 26, 2015, 7 Pages.

(Continued)

*Primary Examiner* — Hung V Ngo
(74) *Attorney, Agent, or Firm* — Reising Ethington P.C

(57) ABSTRACT

A electromagnetic shielding member whose tubular shape is maintained with a simpler structure. The electromagnetic shielding member includes a pluralities of first and second protrusions that are respectively formed at first and second edges in a circumferential direction of a metal plate member that has been bent into a tubular shape. The plurality of first protrusions are formed, spaced apart in a longitudinal direction, each of the first protrusions having a first wider portion closer to its tip than the first narrower portion. The plurality of second protrusions are formed, spaced apart in the longitudinal direction, each of the second protrusions having a (Continued)

second wider portion closer to its tip than the second narrower portion. The metal plate member is formed into the tubular shape so that the first protrusions and the second protrusions are engaged with each other and are interposed with each other.

3 Claims, 5 Drawing Sheets

(56) References Cited

U.S. PATENT DOCUMENTS

| | | | | |
|---|---|---|---|---|
| 3,461,531 | A * | 8/1969 | De Gain | B21D 37/0803 138/173 |
| 3,577,621 | A * | 5/1971 | De Gain | B21D 15/06 29/454 |
| 4,490,422 | A * | 12/1984 | Pascher | B29C 61/10 138/156 |
| 4,684,762 | A * | 8/1987 | Gladfelter | D03D 15/00 139/425 R |
| 5,239,888 | A | 8/1993 | Sevault | |
| 7,841,063 | B2 * | 11/2010 | Lutz | B21C 37/0803 29/463 |
| 2012/0267138 | A1 * | 10/2012 | Fuenfer | B21C 37/08 173/200 |
| 2013/0175079 | A1 * | 7/2013 | Adachi | B60R 16/0215 174/350 |
| 2013/0299234 | A1 * | 11/2013 | Izawa | H02G 3/0406 174/70 R |
| 2014/0360771 | A1 * | 12/2014 | Itani | H05K 9/0098 174/354 |
| 2015/0129296 | A1 * | 5/2015 | Cataldo | H02G 3/0468 174/388 |
| 2015/0250079 | A1 * | 9/2015 | Sugino | H05K 9/0009 174/372 |

FOREIGN PATENT DOCUMENTS

| | | |
|---|---|---|
| JP | 2000077881 A | 3/2000 |
| JP | 2013162728 A | 8/2013 |
| WO | WO2008099836 A1 | 8/2008 |

OTHER PUBLICATIONS

English Translation of International Search Report for Application No. PCT/JP2015/058399 Dated May 26, 2015, 2 Pages.
International Preliminary Search Report for PCT/JP2015/058399, 3 pages.

* cited by examiner

US 9,681,594 B2

ELECTROMAGNETIC SHIELDING MEMBER

CROSS REFERENCE TO RELATED APPLICATIONS

This application claims the priority of Japanese patent application JP2014-080053 filed on Apr. 9, 2014, the entire contents of which are incorporated herein.

TECHNICAL FIELD

The present invention relates to an electromagnetic shielding member for blocking electromagnetic noise.

BACKGROUND ART

In a wire harness installed in a vehicle, a shielded electrical wire includes an electrical wire that is to be shielded and an electromagnetic shielding member for covering this electrical wire.

Patent Document 1 (JP2013-162728A) discloses an electromagnetic shielding member obtained by bending a flexible plate member made of a metal material into a tubular shape.

The electromagnetic shielding member disclosed in Patent Document 1 can be obtained by bending the plate member made of a metal material into a tubular shape such that a first outer edge of four outer edges of the metal plate member and a second outer edge located opposite to the first outer edge overlap with each other.

The tubular shape of the electromagnetic shielding member disclosed in Patent Document 1 is maintained by connecting the first outer edge and the second outer edge with screws. Also, Patent Document 1 discloses that the tubular shape is maintained by connecting the first outer edge and the second outer edge through welding.

SUMMARY OF INVENTION

In the electromagnetic shielding member disclosed in Patent Document 1, if the first outer edge and the second outer edge are connected to each other by screws or by welding, a component, jig, and equipment for joining them together are required. In this case, the cost for manufacturing an electromagnetic shielding member increases.

An object of the present design is to provide an electromagnetic shielding member whose tubular shape can be maintained with a simpler structure.

An electromagnetic shielding member according to a first aspect is a tubular electromagnetic shielding member having a structure obtained by bending a metal plate member into a tubular shape, the electromagnetic shielding member including a plurality of first protrusions and a plurality of second protrusions that are respectively formed at a first edge and a second edge in a circumferential direction of the metal plate member that has been bent into the tubular shape. The plurality of first protrusions are formed at the first edge, spaced apart in a longitudinal direction of the tubular member, each of the first protrusions having a first wider portion that is wider in the longitudinal direction than a first narrower portion, and closer to its tip than the first narrower portion. The plurality of second protrusions are formed at the second edge, spaced apart in the longitudinal direction, each of the second protrusions having a second wider portion that is wider in the longitudinal direction than a second narrower portion, and closer to its tip than the second narrower portion. The metal plate member is formed into the tubular shape in a state in which the first protrusions and the second protrusions are engaged with each other and the first protrusions are interposed between the second protrusions. The electromagnetic shielding member further includes a bendable portion for allowing the electromagnetic shielding member to undergo bending deformation, and non-bendable portions that are continuous with the bendable portion in the longitudinal direction and that have the same diameter. The first protrusions and the second protrusions are provided only at the first edge and the second edge of the non-bendable portions.

An electromagnetic shielding member according to a second aspect is an embodiment of the electromagnetic shielding member according to the first aspect. In the electromagnetic shielding member according to the second aspect, the first protrusions each have a portion whose width in the longitudinal direction widens from the first narrower portion to the first wider portion of the first protrusion, and the second protrusions each have a portion whose width in the longitudinal direction widens from the second narrower portion to the second wider portion of the second protrusion.

An electromagnetic shielding member according to a fourth aspect is an embodiment of the electromagnetic shielding member according to the first or second aspect. In the electromagnetic shielding member according to the fourth aspect, the bendable portion has an accordion structure in which protruding crests extending along the circumferential direction of the tubular member and recessed troughs extending along the circumferential direction are continuous with each other in the longitudinal direction.

In the above-described aspects, the first protrusion may be sandwiched between second protrusions that are located on both sides of this first protrusion. The first wider portion of the first protrusion may be engaged with the second wider portions of the second protrusions that are located on both sides of this first protrusion. Also, the second protrusion may be sandwiched between the first protrusions that are located on both sides of this second protrusion. The second wider portion of the second protrusion is engaged with first wider portions of first protrusions that are located on both sides of this second protrusion. Accordingly, the first edge and the second edge of the metal plate member are connected to each other, and the metal plate member is formed into a tubular shape. In this case, it is possible to provide an electromagnetic shielding member whose tubular shape is maintained with a simpler structure.

Also, in the above-described second aspect, the first protrusions and the second protrusions are tightly engaged with each other by a force applied in a direction enlarging a hollow portion of the tubular electromagnetic shielding member. As a result, it is possible to further avoid a situation where the connection for maintaining the tubular shape of the electromagnetic shielding member breaks off.

Also, in the above-described aspects, the electromagnetic shielding member has the bendable portion for allowing this electromagnetic shielding member to undergo bending deformation. The electromagnetic shielding member in the above described aspects is effective in the case where an electrical wire that is to be shielded is routed in a curved path.

Also, in the above-described fourth aspect, the bendable portion has an accordion structure in which protruding crests extending along the circumferential direction of the tubular member and recessed troughs extending along the circumferential direction are continuous with each other in the longitudinal direction. In this case, it is possible to further reduce the possibility that liquid such as water and foreign matter, such as gravel from the outside, will enter the electromagnetic shielding member.

DESCRIPTION OF EMBODIMENTS

Hereinafter, embodiments will be described with reference to the accompanying drawings. The embodiments below are merely specific examples of the present invention and are not to be construed as limiting the technical scope of the invention.

First Embodiment

Figure 1:
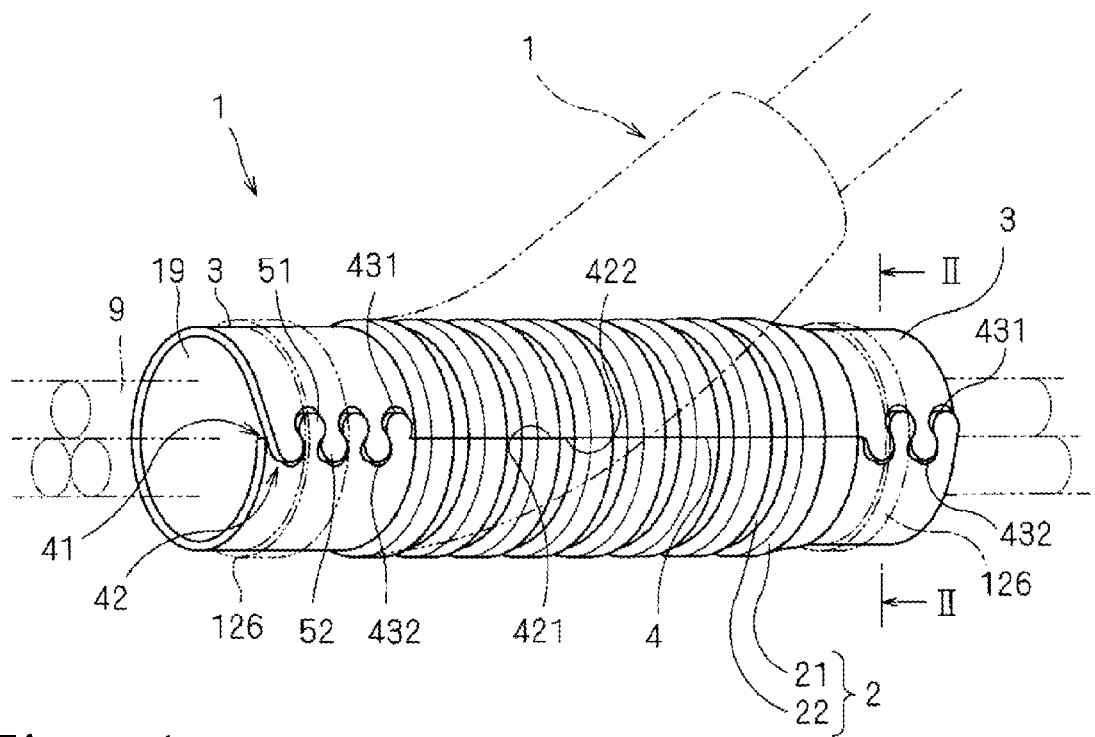
FIG. 1 is a lateral perspective view of an electromagnetic shielding member 1 according to a first embodiment.
Figure 2:
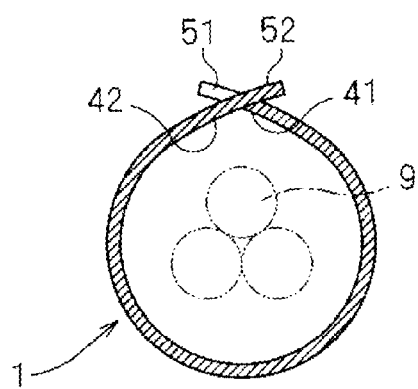
FIG. 2 is a cross-sectional view of the electromagnetic shielding member 1.
Figure 3:
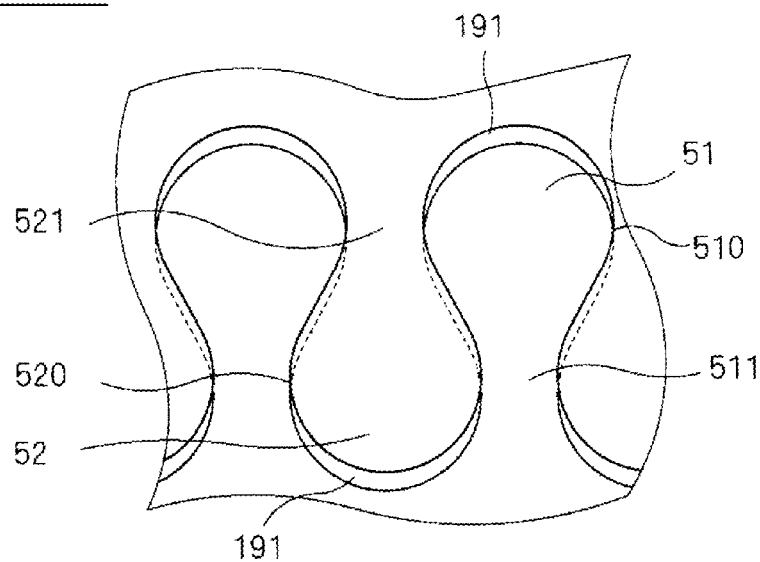
FIG. 3 is an enlarged plan view of first protrusions and second protrusions of the electromagnetic shielding member 1.
Figure 4:
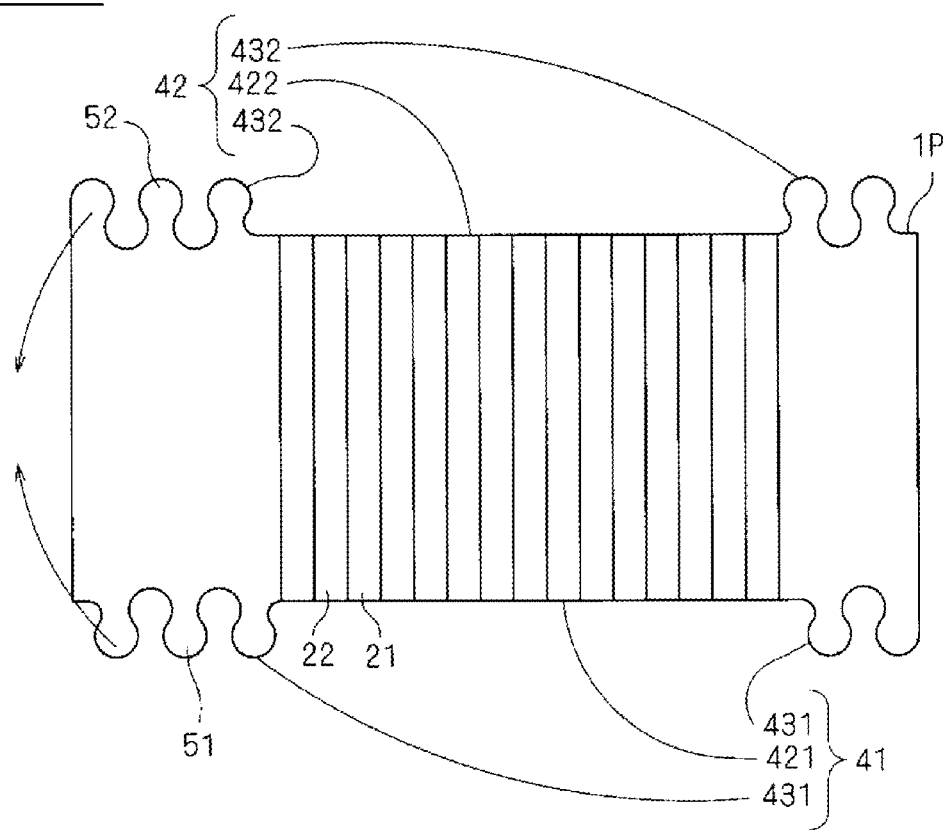
FIG. 4 is a plan view of a metal plate member that constitutes the electromagnetic shielding member 1.

An electromagnetic shielding member 1 according to a first embodiment will be described with reference to FIGS. 1 to 4. FIG. 1 is a lateral perspective view of the electromagnetic shielding member 1. FIG. 2 is a cross-sectional view of the electromagnetic shielding member 1 on II-II plane in FIG. 1. FIG. 4 is a plan view of a metal plate member 1P that constitutes the electromagnetic shielding member 1 according to the present embodiment.

The electromagnetic shielding member 1 is a tubular body having a structure in which the metal plate member 1P is bent into a tubular shape. The electromagnetic shielding member 1 has a hollow portion 19 into which an electrical wire 9 that is to be shielded is insertable.

The present embodiment is an example in which the electromagnetic shielding member 1 is obtained by bending a plate-shaped metal plate member 1P into a tubular shape. A soft and light metal such as aluminum may be adopted as a metal constituting the electromagnetic shielding member 1 (the metal plate member 1P), for example.

The electromagnetic shielding member 1 includes first protrusions 51 and second protrusions 52 that are respectively formed at a first edge 41 and a second edge 42 in the circumferential direction of the metal plate member 1P that has been bent into a tubular shape. In the present embodiment, the electromagnetic shielding member 1 further includes a bendable portion 2 for allowing the electromagnetic shielding member 1 to undergo bending deformation. Also, in the present embodiment, the electromagnetic shielding member 1 further includes non-bendable portions 3 that are adjacent to this bendable portion 2 in the longitudinal direction of the electromagnetic shielding member 1. Note that the longitudinal direction of the tubular electromagnetic shielding member 1 (tubular body) is an axial direction of the tubular electromagnetic shielding member 1, and is also a direction orthogonal to the circumferential direction of the tubular electromagnetic shielding member 1.

In the present embodiment, the bendable portion 2 of the electromagnetic shielding member 1 has an accordion structure in which protruding crests 21 extending along the circumferential direction of the electromagnetic shielding member 1 and recessed troughs 22 extending along the circumferential direction of the electromagnetic shielding member 1 are continuous with each other in the longitudinal direction of the electromagnetic shielding member 1.

Also, in the present embodiment, a slit 4 extending in the longitudinal direction of the electromagnetic shielding member 1 is formed at the bendable portion 2. This slit 4 is a cut defined by the end surface of the first edge 41 and the end surface of the second edge 42 in the metal plate member 1P, and also serves as a separation line of the electromagnetic shielding member 1.

The crests 21 include protruding portions that bend and are continuous with each other on the outer circumferential surface of the electromagnetic shielding member 1. Note that, on the inner circumferential surface of the electromagnetic shielding member 1, the crests 21 form grooves that face the hollow portion 19 of the electromagnetic shielding member 1. For example, the crests 21 may include protruding portions (continuous protruding portions) without a gap throughout at least half a circumference of the electromagnetic shielding member 1. In the present embodiment, the crests 21 include protruding portions that are continuous and curve along the circumferential direction of the electromagnetic shielding member 1 in a region excluding the slit 4.

The troughs 22 include recessed portions that are continuous and curve along the circumferential direction of the electromagnetic shielding member 1. For example, the troughs 22 may include recessed portions (continuous recessed portions) without a gap throughout at least half a circumference of the electromagnetic shielding member 1. In the present embodiment, the troughs 22 include recessed portions that are continuous and curve along the circumferential direction of the electromagnetic shielding member 1 in a region excluding the slit 4.

Note that the troughs 22 form grooves that face toward the outer circumference side of the electromagnetic shielding member 1 on the outer circumferential surface side of the electromagnetic shielding member 1. Note that the troughs 22 form protruding portions that protrude toward the hollow portion 19 of the electromagnetic shielding member 1 on the inner circumferential surface side of the electromagnetic shielding member 1.

In the present embodiment, the bendable portion 2 is deformable such that a distance decreases between protruding crests 21 that are adjacent across a trough 22 that recesses inward in the bending direction. Also, the bendable portion 2 deforms such that a distance increases between protruding crests 21 that are adjacent across a trough 22 that recesses outward in the bending direction. Accordingly, the electromagnetic shielding member 1 can bend. In FIG. 1, an electromagnetic shielding member 1 having a curved shape is drawn with phantom lines.

In the present embodiment, the non-bendable portions 3 of the electromagnetic shielding member 1 are formed adjacent to the bendable portion 2 in the longitudinal direction of the electromagnetic shielding member 1. In the present embodiment, the non-bendable portions 3 are portions that are continuous with the bendable portion in the longitudinal direction and that have the same diameter.

Unlike the bendable portion 2, even when the electromagnetic shielding member 1 has a curved shape, the non-bendable portions 3 do not deform.

In the example shown in FIG. 1, the contours of the outer circumferential surface and the inner circumferential surface of the non-bendable portion 3 are circular. For example, the contours of the outer circumferential surface and the inner circumferential surface of the non-bendable portion 3 may have a perfectly circular, elliptical, oblong shape (rectangular shape with rounded corners), or the like. Also, the contours of the outer circumferential surface and the inner circumferential surface of the non-bendable portion 3 may have a polygonal shape.

Also, in the example shown in FIG. 1, the electromagnetic shielding member 1 includes one bendable portion 2 and two non-bendable portions 3 that are adjacent to this bendable portion 2. However, the electromagnetic shielding member 1 may include only one bendable portion 2, that is, the bendable portion 2 may be formed over the entire length of the electromagnetic shielding member 1.

Also, the electromagnetic shielding member 1 may include only one non-bendable portion 3. For example, a portion of the electromagnetic shielding member 1 having the same diameter may be continuous over the entire length of the electromagnetic shielding member 1. In addition, the electromagnetic shielding member 1 may include one non-bendable portion 3 and two bendable portions 2 that are adjacent to this non-bendable portion 3, or may include a plurality of bendable portions 2 and a plurality of non-bendable portions 3.

In the present embodiment, the first edge 41 and the second edge 42 each include one edge portions of the bendable portion 2 and two edge portions of the non-bendable portions 3, the first edge 41 and the second edge 42 being edges in the circumferential direction of the metal plate member 1P having a structure in which the metal plate member 1P is bent into a tubular shape.

In this specification, a pair of edge portions in the bendable portion 2 are respectively denoted by central edge portions 421 and 422. Also, a pair of edge portions in the non-bendable portions 3 are respectively denoted by edge portions 431 and 432 at the ends. Thus, the slit 4 can be regarded as a separation line defined by the end surface of the central edge portion 421 and the end surface of the central edge portion 422.

In the present embodiment, the first edge 41 includes the central edge portion 421 and the two edge portions 431 at the end. Also, the second edge 42 includes the central edge portion 422 and two edge portions 432 at the end.

In the present embodiment, the first protrusions 51 are formed at the edge portion 431 at the end of the first edge 41. Also, the second protrusions 52 are formed at the edge portion 432 at the end of the second edge 42. Note that the first protrusions 51 may also be formed at the central edge portion 421 of the first edge 41, and the second protrusions 52 may also be formed at the central edge portion 422 of the second edge 42. This will be described later.

In the present embodiment, the first protrusions 51 and the second protrusions 52 have the same shape.

A plurality of first protrusions 51 are formed at the first edge 41, spaced apart in the longitudinal direction of the electromagnetic shielding member 1, and in the present embodiment, are formed at the edge portion 431 at the end of the first edge 41. The first protrusions 51 each have a first wider portion 510 that is wider in the longitudinal direction of the electromagnetic shielding member 1 than a first narrower portion 511. The first wider portion 510 is closer to the tip of the first protrusion 51 than the first narrower portion 511. Here, the first wider portion 510 is close to the tip of the first protrusion 51 relative to the first narrower portion 511. Thus, even if both the first wider portion 510 and the first narrower portion 511 are provided near the tip of the first protrusion 51, it is sufficient that the first wider portion 510 is located nearer the tip than the first narrower portion 511. Also, even if both the first wider portion 510 and the first narrower portion 511 are provided at positions near the first edge 41 of the first protrusion 51, it is sufficient that the first wider portion 510 is located nearer the tip than the first narrower portion 511.

In the present embodiment, the first narrower portion 511 is a portion that is contiguous with the edge portion 431 at the end of the first edge 41. That is, in the present embodiment, the first protrusions 51 protrude outward from the edge portion 431 at the end of the first edge 41. Note that in the present embodiment, "tip of the first protrusion 51" refers to an end opposite to the edge portion 431 at the end of the first protrusion 51.

A plurality of the second protrusions 52 are formed at the edge portions 432 at the end of the second edge 42, spaced apart in the longitudinal direction of the electromagnetic shielding member 1. The second protrusions 52 each has a second wider portion 520 that is wider in the longitudinal direction of the electromagnetic shielding member 1 than the second narrower portion 521. The second wider portion 520 is closer to the tip of the second protrusion 52 than the second narrower portion 521. Here, the second wider portion 520 is close to the tip of the second protrusion 52 relative to the second narrower portion 521. Thus, even if both the second wider portion 520 and the second narrower portion 521 are provided near the tip of the second protrusion 52, it is sufficient that the second wider portion 520 is located nearer the tip than the second narrower portion 521. Also, even if both the second wider portion 520 and the second narrower portion 521 are provided near the second edge 42 of the second protrusion 52, it is sufficient that the second wider portion 520 is located nearer the tip than the second narrower portion 521.

In the present embodiment, the second narrower portions 521 are contiguous with the edge portion 432 at the end of the second edge 42. That is, in the present embodiment, the second protrusions 52 protrude outward from the edge portion 432 at the end of the second edge 42. Note that in the present embodiment, "tip of the second protrusion 52" refers to an end opposite to the edge portion 432 at the end of the second protrusion 52.

In the present embodiment, each first protrusion 51 has a portion whose width in the longitudinal direction of the electromagnetic shielding member 1 widens from the first narrower portion 511 to the first wider portion 510 of the first protrusion 51. For example, the first protrusion 51 may have a portion whose width gradually widens in the longitudinal direction of the electromagnetic shielding member 1 from the first narrower portion 511 to the first wider portion 510 of the first protrusion 51.

Also, in the present embodiment, each second protrusion 52 has a portion whose width in the longitudinal direction of the electromagnetic shielding member 1 widens from the second narrower portion 521 to the second wider portion 520 of the second protrusion 52. For example, the second protrusion 52 may have a portion whose width gradually widens in the longitudinal direction of the electromagnetic shielding member 1 from the second narrower portion 521 to the second wider portion 520 of the second protrusion 52. Note that FIG. 3 is an enlarged diagram of the first protrusions 51 and the second protrusions 52 in the present embodiment.

For convenience, in this specification, the first wider portion 510 is defined as a widest portion of the first protrusion 51. In the example shown in FIG. 3, the first wider portion 510 is formed at a middle position between the base portion (the first narrower portion 511) of the first protrusion 51 and the portion nearest the tip. Also, similarly to the first protrusion 51, in this specification, the second wider portion 520 is defined as the widest portion of the second protrusion 52. In the example shown in FIG. 3, the second wider portion 520 is formed at a middle position between the base portion (the second narrower portion 521) of the second protrusion 52 and the portion nearest the tip.

In the present embodiment, the width of a gap between the second narrower portions 521 of the second protrusions 52 in the longitudinal direction of the electromagnetic shielding member 1 is the same as the width of the first wider portion 510 of the first protrusion 51.

Also, in the present embodiment, the width of a gap between the first narrower portions 511 of the first protrusions 51 in the longitudinal direction of the electromagnetic shielding member 1 is the same as the width of the second wider portion 520 of the second protrusion 52.

Note that the width of a gap between the second narrower portions 521 of the second protrusions 52 in the longitudinal direction of the electromagnetic shielding member 1 may be smaller than the width of the first wider portion 510 of the first protrusion 51, or may be larger than the width of the first wider portion 510 of the first protrusion 51. Also, the width of a gap between the first narrower portions 511 of the first protrusions 51 in the longitudinal direction of the electromagnetic shield member 1 may be smaller than the width of the second wider portion 520 of the second protrusion 52, or may be larger than the width of the second wider portion 520 of the second protrusion 52.

Also, in the example shown in FIGS. 1 and 3, a portion that connects two adjacent first protrusions 51 and that is closer to the base portion than the first narrower portion 511 between the two adjacent first protrusions 51 has a curved edge shape. In this case, the gap between the first protrusions 51 into which the second protrusion 52 is inserted can be increased. However, this portion may also have a linear edge shape.

Also, in the example shown in FIGS. 1 and 3, a portion that connects adjacent second protrusions 52 and that is closer to the base portion than the second narrower portion 521 between the adjacent second protrusions 52 has a curved edge shape. In this case, the gap between the second protrusions 52 into which the first protrusion 51 is inserted can be increased. However, this portion may also have a linear edge shape.

In the electromagnetic shielding member 1, the first protrusions 51 and the second protrusions 52 are engaged with each other, and the metal plate member 1P is formed into a tubular shape in a state in which the first protrusions 51 are interposed between the second protrusions 52. That is, the tubular electromagnetic shielding member 1 can be obtained by engaging the first protrusion 51 and second protrusions 52 that are located on both sides of this first protrusion 51 with each other in a state in which the first protrusions 51 are interposed between the second protrusions 52.

For example, the first protrusions 51 are inserted into the gaps between the second protrusions 52. In the present embodiment, the first wider portions 510 of the first protrusions 51 are inserted into the gaps between the second protrusions 52, that is, the task of putting the first protrusions 51 between the second protrusions 52 is performed such that a portion of the first protrusions 51 overlaps with the outer circumferential surface of the second edge 42.

In the present embodiment, if a force is applied to the electromagnetic shielding member 1 in a direction in which the first edge 41 and the second edge 42 are separated from each other, in a state in which the first protrusions 51 are located between the second protrusions 52 of the electromagnetic shielding member 1, the first wider portions 510 of the first protrusions 51 are engaged with the second wider portions 520 of the second protrusions 52 that are located on both sides of this first protrusions 51. At this time, as shown in FIG. 3, a hole 191 at which the hollow portion 19 of the electromagnetic shielding member 1 is exposed may be formed between a portion near the tip of the first protrusions 51 and a portion of the edge portion 432 at the end, where no second protrusions 52 are formed. Note that the direction in which the first edge 41 and the second edge 42 are separated from each other is also a direction enlarging the hollow portion 19 of the tubular electromagnetic shielding member 1.

Similarly to the first protrusions 51, in the second protrusions 52 as well, if a force is applied to the electromagnetic shielding member 1 in a direction in which the first edge 41 and the second edge 42 are separated from each other, in a state in which the second protrusions 52 are located between the first protrusions 51 of the electromagnetic shielding member 1, the second wider portions 520 of the second protrusions 52 are engaged with the first wider portions 510 of the first protrusions 51 that are located on both sides of this second protrusions 52.

Thus, in the present embodiment, the first protrusions 51 and the second protrusions 52 are engaged with each other in a state in which portions of the first protrusions 51 overlap with the second edge 42 on the outer circumferential surface of the electromagnetic shielding member 1, and in a state in which the portions of the second protrusions 52 overlap with the first edge 41. Accordingly, the first edge 41 and the second edge 42 are connected to each other, maintaining the tubular shape of the electromagnetic shielding member 1.

Also, in the present embodiment, an outer edge line that defines the outer edge of a portion extending from the first narrower portion 511 to the first wider portion 510 curves and inclines with respect to the direction in which the first protrusions 51 protrude from the first edge 41. However, this outer edge line may also be linear. Note that the inclination of this outer edge line, that is, the angle of the inclination may be determined as appropriate.

Also, in the present embodiment, the first protrusions 51 of the first edge 41 and the second protrusions 52 of the second edge 42 are formed by pressing the flat plate-shaped metal plate member 1P before the metal plate member 1P is bent into tubular shape. In this case, the first edge 41 and the second edge 42 can be easily provided with first protrusions 51 and second protrusions 52 of different shapes.

The electromagnetic shielding member 1 is used in a state in which the electromagnetic shielding member 1 surrounds the electrical wires 9 that are to be shielded, that is, in a state in which the electrical wires 9 are inserted into the hollow portion 19 of the electromagnetic shielding member 1. In FIG. 1, the electrical wires 9 are drawn with phantom lines (chain-double dashed lines). The electrical wires 9 are insulated electrical wires having a conductor containing copper, aluminum, or the like as a main component, and an insulating coating for covering the periphery of this conductor.

In the example shown in FIG. 1, the electromagnetic shielding member 1 surrounds three electrical wires 9. Note that the electromagnetic shielding member 1 may also surround just one electrical wire 9, surround two electrical wires 9, or surround four or more electrical wires 9.

The wire harness including the electrical wires 9 and the electromagnetic shielding member 1 may be installed in a vehicle such as a car, for example. Also, when the wire harness is installed in a vehicle, the wire harness may include a binding member 126, such as a clamp, for reliably preventing the opening of the electromagnetic shielding member 1.

In the present embodiment, the first protrusion 51 is sandwiched between second protrusions 52 that are located on both sides of this first protrusion 51. Then, the first wider portion 510 of the first protrusion 51 is engaged with the second wider portions 520 of the second protrusions 52 that are located on both sides of this first protrusion 51. Also, the second protrusion 52 may be sandwiched between the first protrusions 51 that are located on both sides of this second protrusion 52. Thus, the second wider portion 520 of the second protrusion 52 is engaged with the first wider portions 510 of the first protrusions 51 that are located on both sides of this second protrusion 52. Accordingly, the first edge 41 and the second edge 42 of the metal plate member 1P are connected to each other, and the metal plate member 1P is formed into a tubular shape. In this case, it is possible to provide an electromagnetic shielding member 1 whose tubular shape is maintained with a simpler structure.

Also, in the present embodiment, the first protrusion 51 and the second protrusion 52 are tightly engaged with each other by a force applied in a direction enlarging the hollow portion 19 of the tubular electromagnetic shielding member 1. As a result, it is possible to reduce the possibility that the connection for maintaining the tubular shape of the electromagnetic shielding member 1 will be released.

Also, in the present embodiment, the electromagnetic shielding member 1 includes a bendable portion 2 for allowing the electromagnetic shielding member 1 to undergo bending deformation. The electromagnetic shielding member 1 is effective in the case where the electrical wires 9 that are to be shielded are routed in a curved path.

Also, in the present embodiment, it is possible to reduce the possibility that liquid such as water and foreign matter, such as gravel, will enter the electromagnetic shielding member 1 from the outside.

Second Embodiment

Next, an electromagnetic shielding member 1A according to a second embodiment will be described with reference to FIG. 5. In the electromagnetic shielding member 1A, a portion of first protrusions 51 overlap with a second edge 42 in a state in which the first protrusions 51 are located on the inner circumferential surface side of the electromagnetic shielding member 1A.

Figure 5:
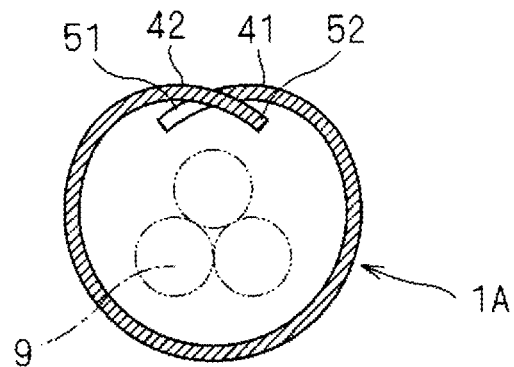
FIG. 5 is a cross-sectional view of an electromagnetic shielding member 1A according to a second embodiment.

FIG. 5 is a cross-sectional view of the electromagnetic shielding member 1A. Note that constituent elements that are the same as the constituent elements shown in FIGS. 1 to 4 will be assigned the same reference signs in FIG. 5. Hereinafter, a difference between the electromagnetic shielding member 1A and the electromagnetic shielding member 1 will be described.

In the present embodiment, portions of first protrusions 51 overlap with a second edge 42 on the inner circumferential surface side of the electromagnetic shielding member 1A. That is, the second protrusions 51 are sandwiched between the second protrusions 52 in a state in which portions of the first protrusions 51 are located in the hollow portion 19 of the electromagnetic shielding member 1A. Also, portions of second protrusions 52 overlap with the first edge 41 on the inner circumferential surface side of the electromagnetic shielding member 1A. That is, the first protrusions 52 are sandwiched between the first protrusions 51 in a state in which portions of the second protrusions 52 are located in the hollow portion 19 of the electromagnetic shielding member 1A.

The electromagnetic shielding member 1A maintains its tubular shape due to the above-described connection structure. In the present embodiment, a similar effect to the first embodiment can also be obtained.

Also, in the present embodiment, if a force is applied in a direction enlarging the hollow portion 19 of the electromagnetic shielding member 1A, the portions of the first protrusions 51 that are located on the inner circumferential surface side of the first edge 41 come into contact with the inner circumferential surface of the electromagnetic shielding member 1A. Also, the portions of the second protrusions 52 that are located on the inner circumferential surface side of the second edge 42 come into contact with the inner circumferential surface of the electromagnetic shielding member 1A. In this case, it is possible to further reduce the possibility that the connection resulting from the first protrusions 51 being locked to the second protrusions 52 will be released.

Third Embodiment

Figure 6:
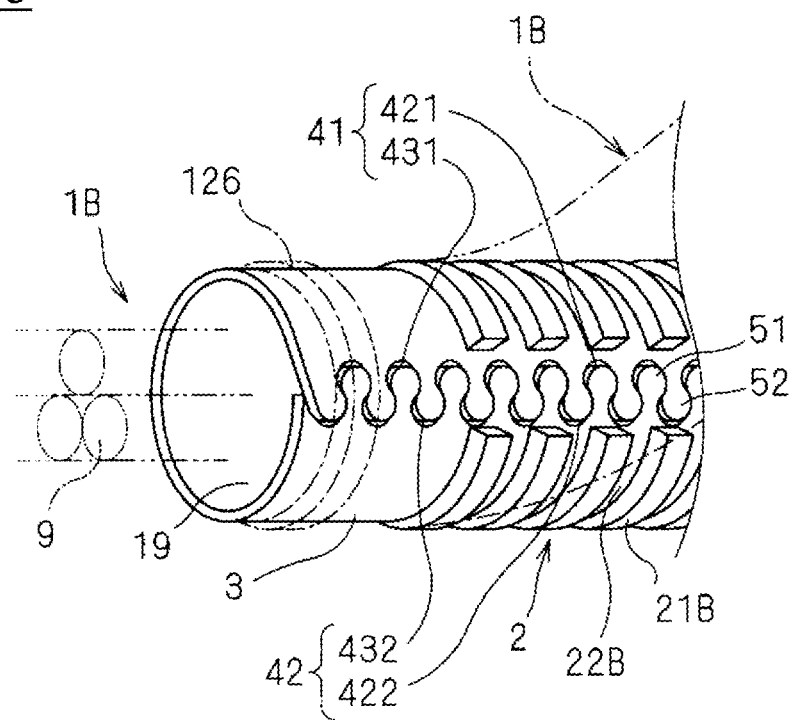
FIG. 6 is a lateral perspective view of an electromagnetic shielding member 1B according to a third embodiment.

Next, an electromagnetic shielding member 1B according to a third embodiment will be described with reference to FIG. 6. FIG. 6 is a lateral perspective view of the electromagnetic shielding member 1B. Note that constituent elements that are the same as the constituent elements shown in FIGS. 1 to 5 will be assigned the same reference signs in FIG. 6.

In the electromagnetic shielding member 1B, the first protrusions 51 are formed at a central edge portion 421 and an edge portion 431 at the end. Also, second protrusions 52 are formed at a central edge portion 422 and an edge portion 432 at the end. Hereinafter, a difference between the electromagnetic shielding member 1B and the electromagnetic shielding member 1 will be described.

In the present embodiment, protruding crests 21B and recessed troughs 22B are formed along the circumferential direction of the electromagnetic shielding member 1B in a region excluding the first protrusions 51, the second protrusions 52, the first edge 41, and the second edge 42. However, the protruding crests 21B and the recessed troughs 22B may also be formed along the circumferential direction of the electromagnetic shielding member 1B in a region excluding the first protrusions 51 and the second protrusions 52, that is, in a region extending from the first edge 41 to the second edge 42.

In the present embodiment, a similar effect to the first embodiment can also be obtained. Also, because the number of first protrusions 51 and the number of second protrusions 52 increase, the connection for maintaining the tubular shape of the electromagnetic shielding member 1B is more unlikely to be released.

Fourth Embodiment

Figure 7:
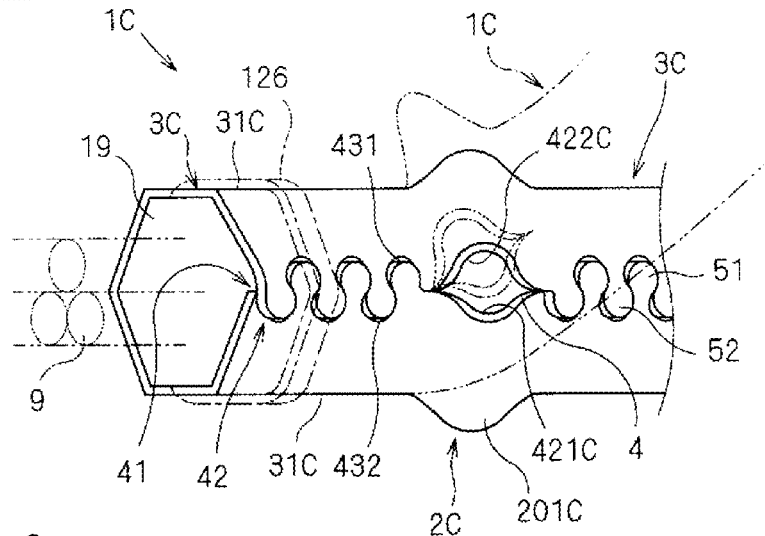
FIG. 7 is a lateral perspective view of an electromagnetic shielding member 1C according to a fourth embodiment.
Figure 8:
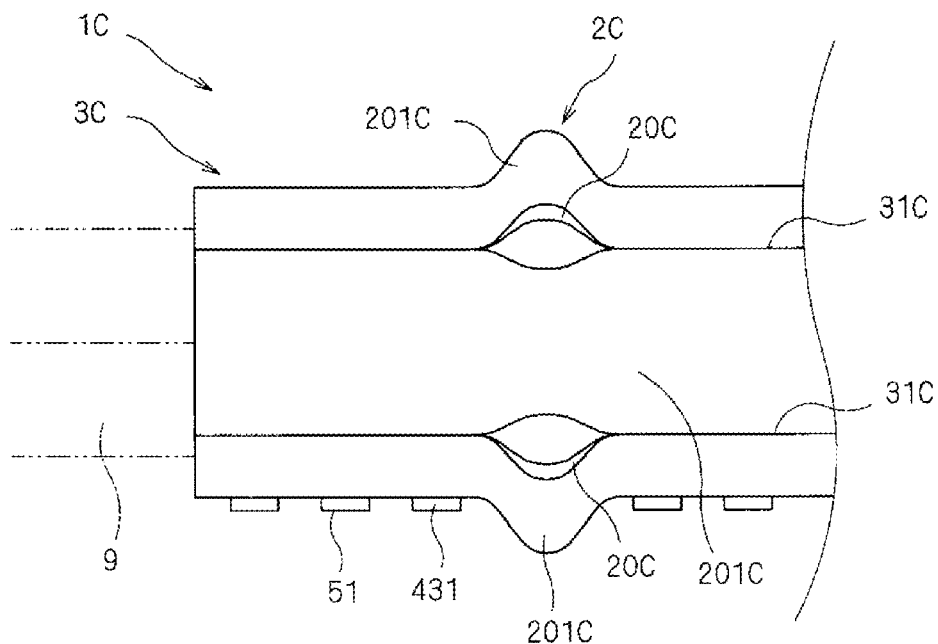
FIG. 8 is a plan view of the electromagnetic shielding member 1C.

Next, an electromagnetic shielding member 1C according to a fourth embodiment will be described with reference to FIGS. 7 and 8. FIG. 7 is a lateral perspective view of the electromagnetic shielding member 1C. FIG. 8 is a plan view of the electromagnetic shielding member 1C. Note that constituent elements that are the same as the constituent elements shown in FIGS. 1 to 6 will be assigned the same reference signs in FIGS. 7 and 8.

The electromagnetic shielding member 1C has a bendable portion 2C having a different structure from the structures of the electromagnetic shielding members 1, 1A, and 1B. Hereinafter, a difference between the electromagnetic shielding member 1C and the electromagnetic shielding members 1, 1A, and 1B will be described.

The bendable portion 2C is a portion in which a plurality of cuts 20C are arranged in parallel to each other in the circumferential direction. In the present embodiment, each of the cuts 20C is formed along the longitudinal direction. Note that each of the cuts 20C may be formed along a direction oblique to the longitudinal direction of the tubular electromagnetic shielding member 1C.

Also, in the present embodiment, in the bendable portion 2C, the plurality of cuts 20C are formed in the circumferential direction at equal intervals. In the example shown in FIGS. 7 and 8, five cuts 20C are formed in the bendable portion 2C at equal intervals. Also, the slit 4 of the bendable portion 2C defined by a central edge portion 421C and a central edge portion 422C can be effectively regarded as a cut.

In the example shown in FIGS. 7 and 8, six cuts constituted by five cuts 20C and the slit 4 defined by the central edge portion 421C and the central edge portion 422C are formed at spacings in the bendable portion 2C, the six cuts equally dividing the entire circumference. Of course, it is also possible to form two to four cuts 20C, or six or more cuts 20C in the bendable portion 2C.

In the electromagnetic shielding member 1C, belt-shaped portions 201C in the bendable portion 2C between cuts 20C bend more easily than the other portions. Thus, if an external force is applied to the electromagnetic shielding member 1C in its bending direction, portions of the belt-shaped portions 201C bend so as to protrude toward the outer circumferential surface, and thus the bent belt-shaped portion 201C bends inward.

In the present embodiment, the belt-shaped portions 201C between cuts 20C in the bendable portion 2C are bent into such a shape that the belt-shaped portions 201C protrude toward the outer circumferential surface in advance. In the example shown in FIGS. 7 and 8, the belt-shaped portions 201C are bent into a curved shape such that their central portion in the longitudinal direction of the cut 20C protrudes toward the outer circumferential surface side. Accordingly, the cuts 20C open up.

Also, in the present embodiment, a plurality of creases 31C are formed in the non-bendable portion 3C. In the example shown in FIGS. 7 and 8, the plurality of creases 31C are formed at positions same as the positions of the six cuts constituted by the five cuts 20C and the slit 4 defined by the central edge portion 421C and the central edge portion 422C, in the circumferential direction of the electromagnetic shielding member 1C. Note that in the example shown in FIGS. 7 and 8, the creases 31C constitute a protruding shape on the outer circumferential surface side of the non-bendable portion 3C.

In the present embodiment, a similar effect to the first embodiment can also be obtained.

First Application Example

Next, a first protrusion 51X and a second protrusion 52X according to a first application example that can be applied to the electromagnetic shielding members 1, 1A, 1B, and 1C will be described. The shapes of the first protrusion 51X and the second protrusion 52X are different from the shapes of the first protrusion 51 and the second protrusion 52.

Figure 9:
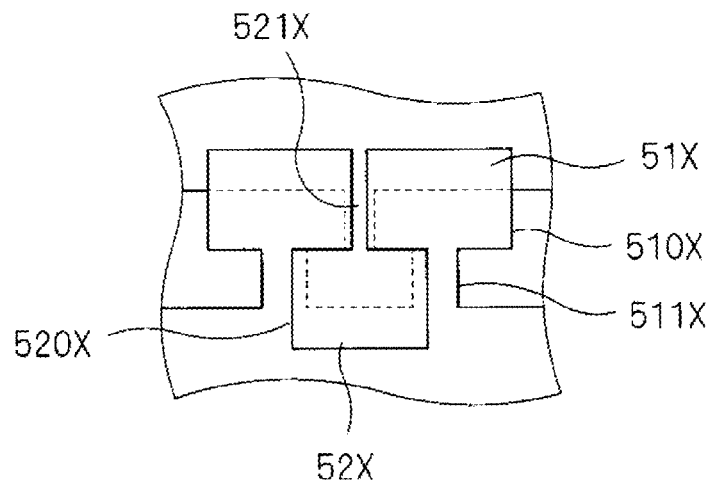
FIG. 9 is an enlarged plan view of a first protrusion and a second protrusion according to a first application example that can be applied to the electromagnetic shielding member 1.

FIG. 9 is an enlarged plan view of the first protrusion 51X and the second protrusion 52X. Note that constituent elements that are the same as the constituent elements shown in FIGS. 1 to 8 will be assigned the same reference signs in FIG. 9. The first protrusion 51X and the second protrusion 52X differ from the first protrusion 51 and the second protrusion 52, and hereinafter, a difference therebetween will be described.

In the example shown in FIG. 9, the first protrusions 51X and the second protrusions 52X have the same shape.

The first protrusion 51X has a first narrower portion 511X and a first wider portion 510X. The first wider portion 510X extends to the tip of the first protrusion 51X. Note that in this specification, similarly to the first wider portion 510, the first wider portion 510X is defined as a widest portion that is widest in the longitudinal direction of the first protrusion 51X.

Also, in the example shown in FIG. 9, a corner is formed at an outer edge of the portion that extends from the first narrower portion 511X to the first wider portion 510X of the first protrusion 51X. Also, as shown in FIG. 9, the outer edge of the first wider portion 510X is formed into a rectangular shape.

The second protrusion 52X has a second narrower portion 521X and a second wider portion 520X. The second wider portion 520X extends to the tip of the second protrusion 52X. Note that in this specification, similarly to the second wider portion 520, the second wider portion 520X is defined as a widest portion that is widest in the longitudinal direction of the second protrusion 52X.

Also, in the example shown in FIG. 9, a corner is formed at an outer edge of the portion that extends from the second narrower portion 521X to the second wider portion 520X of the second protrusion 52X. Also, as shown in FIG. 9, the outer edge of the second wider portion 520X is formed into a rectangular shape.

In the example shown in FIG. 9, the first wider portion 510X of one first protrusion 51X is engaged with two second wider portions 520X of adjacent second protrusions 52X. Also, the second wider portion 520X of one second protrusion 52X is engaged with two first wider portions 510X of adjacent two first protrusions 51X.

In this application example, the width of the first wider portion 510X of the first protrusion 51X in the longitudinal direction of the electromagnetic shielding member 1 is larger than the width of a gap between the second wider portions 520X of the second protrusions 52X that are located on both sides of this first protrusion 51X. This is similar to the second protrusions 52X.

For example, a portion of the first wider portion 510X of the first protrusion 51X may overlap with a portion at the second edge 42 in which no second protrusions 52X are formed and a portion of the second narrower portion 521X of the second protrusions 52 that are located on both sides of this first protrusion 51X. In this manner, the electromagnetic shielding member 1, 1A, 1B, and 1C to which the first protrusions 51X and the second protrusions 52X according to this application example are applied maintain their tubular shape due to the first protrusions 51X and the second protrusions 52X being locked to each other.

Second Application Example

Next, a first protrusion 51Y and a second protrusion 52Y according to a second application example that can be applied to the electromagnetic shielding members 1, 1A, 1B, and 1C will be described. The shapes of the first protrusion 51Y and the second protrusion 52Y are different from the shapes of the first protrusions 51 and 51X and the second protrusions 52 and 52X.

Figure 10:
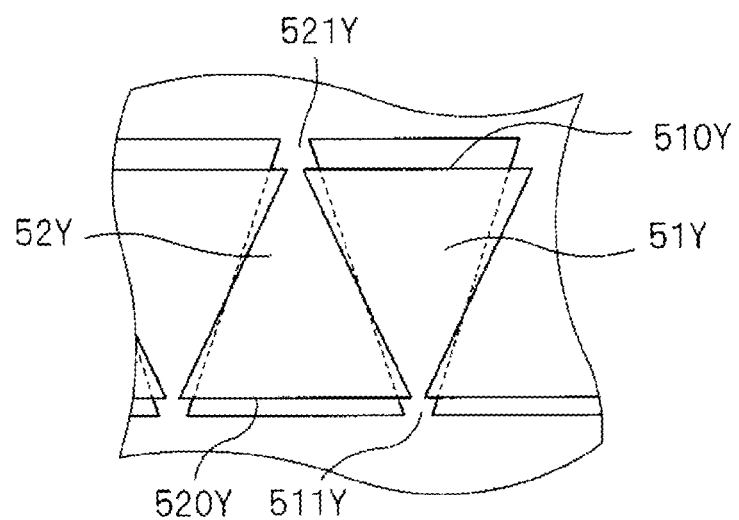
FIG. 10 is an enlarged plan view of a first protrusion and a second protrusion according to a second application example that can be applied to the electromagnetic shielding member 1.

FIG. 10 is an enlarged plan view of the first protrusion 51Y and the second protrusion 52Y. Note that constituent elements that are the same as the constituent elements shown in FIGS. 1 to 9 will be assigned the same reference signs in FIG. 10. The first protrusion 51Y and the second protrusion 52Y differ from the first protrusions 51 and 51X and the second protrusions 52 and 52X, and hereinafter, a difference therebetween will be described.

The first protrusion 51Y has a shape such that its width gradually widens from a first narrower portion 511Y to its tip. In this specification, similarly to the first wider portion 510, the first wider portion 510Y is defined as a widest portion that has the maximum width in the first protrusion 51Y. In this case, the first wider portion 510Y is formed at a portion nearest the tip of the first protrusion 51Y. Also, in the example shown in FIG. 10, the outer edge of the first protrusion 51Y is formed into a trapezoidal shape.

The second protrusion 52Y has a shape such that its width gradually widens from a second narrower portion 521Y to its tip. In this specification, similarly to the second wider portion 520, the second wider portion 520Y is defined as a portion that has the maximum width of the second protrusion 52Y. In this case, the second wider portion 520Y is formed at a portion nearest the tip of the second protrusion 52Y. Also, in the example shown in FIG. 10, the outer edge of the second protrusion 52Y is formed into trapezoidal shape.

In the example shown in FIG. 10, a portion located at a middle position between the first narrower portion 511Y and the first wider portion 510Y of the first protrusion 51Y is engaged with a portion located at a middle position between the second narrower portions 521Y and the second wider portions 520Y of adjacent second protrusions 52Y. Also, the portion located at a middle position between the second narrower portion 521Y and the second wider portion 520Y of the second protrusion 52Y is engaged with a portion located at a middle position between the first narrower portions 511Y and the first wider portions 510Y of adjacent first protrusions 51Y. This maintains the tubular shapes of the electromagnetic shielding members 1, 1A, 1B, and 1C to which the first protrusions 51Y and the second protrusions 52Y are applied.

Third Application Example

Figure 11:
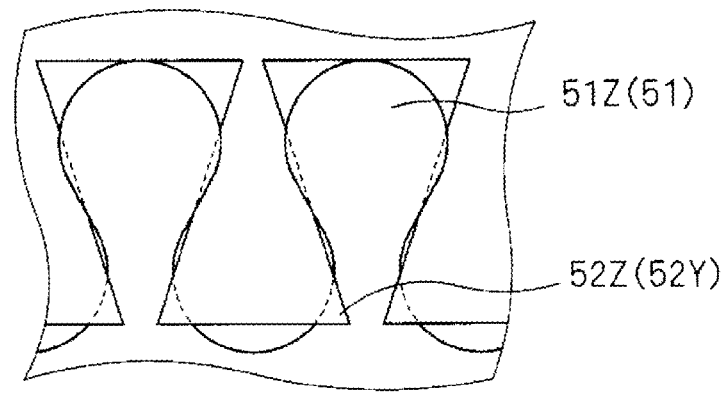
FIG. 11 is an enlarged plan view of a first protrusion and a second protrusion according to a third application example that can be applied to the electromagnetic shielding member 1.

Next, a first protrusion 51Z and a second protrusion 52Z according to a third application example that can be applied to the electromagnetic shielding members 1, 1A, 1B, and 1C will be described. FIG. 11 is an enlarged plan view of the first protrusion 51Z and the second protrusion 52Z. Note that constituent elements that are the same as the constituent elements shown in FIGS. 1 to 10 will be assigned the same reference signs in FIG. 11. The first protrusion 51Z and the second protrusion 52Z differ from the first protrusions 51, 51X, and 51Y and the second protrusions 52, 52X, and 52Y, and hereinafter, a difference therebetween will be described.

In this application example, the first protrusion 51Z and the second protrusion 52Z have different shapes.

In the example shown in FIG. 11, the shape of the first protrusion 51Z is the same as the shape of the first protrusion 51. Also, the shape of the second protrusion 52Z is the same as the shape of the second protrusion 52Y.

FIG. 11 shows the case where the first protrusion 51Z has the same shape as the first protrusion 51 and the second protrusion 52Z has the same shape as the second protrusion 52Y, as an example in which the first protrusion 51Z and the second protrusion 52Z have different shapes. Of course, a combination of the first protrusion 51Z and the second protrusion 52Z may be different from the above-described combination.

In the example shown in FIG. 11, the tubular shapes of the electromagnetic shielding members 1, 1A, 1B, and 1C to which the first protrusions 51Z and the second protrusions 52Z are applied are maintained due to the first protrusions 51Z and the second protrusions 52Z being engaged with each other. Also, in the electromagnetic shielding members 1, 1A, 1B, and 1C to which the first protrusions 51Z and the second protrusions 52Z are applied, the first protrusions 51Z and the second protrusions 52Z are tightly engaged with each other by a force applied in a direction enlarging the hollow portions 19 of the tubular electromagnetic shielding members 1, 1A, 1B, and 1C. As a result, it is possible to avoid a situation where the connection for maintaining the tubular shapes of the electromagnetic shielding members 1, 1A, 1B, and 1C break off.

Note that the electromagnetic shielding member according to the present invention can also be configured not only by freely combining the embodiments and application examples that have been described above but also by modifying the embodiment and application examples, or omitting a portion thereof, as appropriate without departing from the scope of the invention as defined in the claims.

REFERENCE SIGNS LIST

1 Electromagnetic shielding member
126 Binding member
19 Hollow portion
191 Hole
1A Electromagnetic shielding member
1B Electromagnetic shielding member
1C Electromagnetic shielding member
1P Metal plate member
2 Bendable portion
201C Belt-shaped portion
20C Cut
21 Crest
21B Crest
22 Trough
22B Trough 2C Bendable portion
3 Non-bendable portion
31C Crease
3C Non-bendable portion
4 Slit
41 First edge
42 Second edge
421 Central edge portion
421C Central edge portion
422 Central edge portion
422C Central edge portion
431 Edge portion at the end
432 Edge portion at the end
51 First protrusion
510 First wider portion
510X First wider portion
510Y First wider portion
511 First narrower portion
511X First narrower portion
511Y First narrower portion
51X First protrusion
51Y First protrusion
51Z First protrusion
52 Second protrusion
520 Second Wider portion
520X Second Wider portion
520Y Second Wider portion
521 Second narrower portion
521X Second narrower portion
521Y Second narrower portion
52X Second protrusion
52Y Second protrusion
52Z Second protrusion
9 Electrical wire

The invention claimed is:

1. A tubular electromagnetic shielding member having a structure obtained by bending a metal plate member into a tubular shape, the electromagnetic shielding member comprising:

a plurality of first protrusions and a plurality of second protrusions that are respectively formed at a first edge and a second edge in a circumferential direction of the metal plate member that has been bent into the tubular shape, wherein:

the plurality of first protrusions are formed at the first edge, spaced apart in a longitudinal direction of the electromagnetic shielding member, each of the first protrusions having a first wider portion that is wider in the longitudinal direction than a first narrower portion, and closer to its tip than the first narrower portion, the plurality of second protrusions are formed at the second edge, spaced apart in the longitudinal direction, each of the second protrusions having a second wider portion that is wider in the longitudinal direction than a second narrower portion, and closer to its tip than the second narrower portion, and the metal plate member being formed into the tubular shape in a state in which the first protrusions and the second protrusions are engaged with each other and the first protrusions are interposed between the second protrusions, the electromagnetic shielding member further comprises a bendable portion for allowing the electromagnetic shielding member to undergo bending deformation, and non-bendable portions that are continuous with the bendable portion in the longitudinal direction and that have the same diameter;

the first protrusions and the second protrusions are provided only at the first edge and the second edge of the non-bendable portions.

2. The electromagnetic shielding member according to claim 1, wherein the first protrusions each have a portion whose width in the longitudinal direction widens from the first narrower portion to the first wider portion of the first protrusion, and the second protrusions each have a portion whose width in the longitudinal direction widens from the second narrower portion to the second wider portion of the second protrusion.

3. The electromagnetic shielding member according to claim 1, wherein the bendable portion has an accordion structure in which protruding crests extending along the circumferential direction of the electromagnetic shielding member and recessed troughs extending along the circumferential direction are continuous with each other in the longitudinal direction.

* * * * *